US008327179B2

(12) United States Patent
Hsieh

(10) Patent No.: US 8,327,179 B2

(45) Date of Patent: Dec. 4, 2012

(54) ASYNCHRONOUS COUNTER BASED TIMING ERROR DETECTION

(75) Inventor: Hong-Yean Hsieh, Santa Clara, CA (US)

(73) Assignee: Realtek Semiconductor Corp., Hsinchu (TW)

(*) Notice: Subject to any disclaimer, the term of this patent is extended or adjusted under 35 U.S.C. 154(b) by 725 days.

(21) Appl. No.: 12/436,765

(22) Filed: May 6, 2009

(65) Prior Publication Data

US 2009/0307518 A1 Dec. 10, 2009

Related U.S. Application Data

(60) Provisional application No. 61/059,238, filed on Jun. 5, 2008.

(51) Int. Cl.
*G06F 1/00* (2006.01)

(52) U.S. Cl. ........................................ 713/500

(58) Field of Classification Search .................. 713/500
See application file for complete search history.

(56) References Cited

U.S. PATENT DOCUMENTS

| | | | | |
|---|---|---|---|---|
| 6,356,615 | B1 * | 3/2002 | Coon et al. | 377/16 |
| 2006/0103566 | A1 | 5/2006 | Vemulapalli et al. | |
| 2007/0273569 | A1 * | 11/2007 | Lin | 341/155 |

* cited by examiner

*Primary Examiner* — Paul R Myers
*Assistant Examiner* — Jeremy S Cerullo
(74) *Attorney, Agent, or Firm* — McClure, Qualey & Rodack, LLP

(57) ABSTRACT

A method for estimating a timing difference between a first clock signal and a second clock signal is disclosed. The estimating method comprising: generating an edge signal by detecting an edge of the second clock signal by sampling the second clock signal using the first clock signal; generating a delayed edge signal by a further sampling of the second clock signal using the first clock signal; generating a first intermediate code by counting a number of clock edges of the first clock signal within a duration defined by the edge signal using an asynchronous counter; generating a second intermediate code to represent a timing difference between the second clock signal and the delayed edge signal using a time-to-digital converter; and generating an output code using a weighted sum of the first intermediate code and the second intermediate code.

24 Claims, 9 Drawing Sheets

ASYNCHRONOUS COUNTER BASED TIMING ERROR DETECTION

RELATED APPLICATION

This application claims the benefit of U.S. Provisional Application No. 61/059,238, filed on Jun. 5, 2008, having the title "TIMING DETECTION USING AN ASYNCHRONOUS COUNTER IN A FRACTIONAL-N FREQUENCY SYNTHESIZER.", the contents of which are incorporated herein by reference.

BACKGROUND OF THE INVENTION

1. Field of the Invention

The present invention relates generally to a timing error detector. In particular, it relates to the design of an asynchronous counter based timing error detector.

2. Description of the Background Art

The phase-locked loop is a key building block as it can generate a well-defined frequency. The prior art uses a phase-frequency detector and a charge pump to extract the timing relationship between a reference clock and an oscillator clock. The nature of this approach is analog that is inferior in deep submicron technology. An asynchronous counter based timing error detector is presented in this work that utilizes an all-digital implementation to replace the conventional analog-intensive phase-frequency detector and charge pump.

SUMMARY OF THE INVENTION

In one embodiment, a timing error detector is configured to receive a first clock DCOCLK, a second clock REFCLK, and a dither signal DS and to generate a timing error TE. The timing error detector includes an edge detector, an asynchronous counter, a time-to-digital (TDC), and a timing error estimator. The edge detector is configured to receive the first clock DCOCLK, the second clock REFCLK, and the dither signal DS and to generate a pulse signal, a dithered pulse signal, and a delayed dither signal. The dither signal DS is being re-synchronized with the second clock to generate the delayed dither signal. The edge detector detects a rising transition edge of the second clock and generates the pulse signal and the dithered pulse signal based on the binary value of the delayed dither signal. The asynchronous counter is configured to receive the first clock DCOCLK and the pulse signal from the edge detector and to generate a first digital output that is the number of rising edges of the first clock between two neighboring pulse signals. The time-to-digital converter is configured to receive the second clock REFCLK and the dithered pulse signal from the edge detector and to generate a second digital output that represents the timing difference between a rising edge of the second clock and the immediately followed rising edge of the dithered pulse signal. The timing error estimator uses the first digital output to generate a coarse timing error whereas it uses the delayed dither signal and the second digital output to generate a fine timing error. The subtraction of the fine timing error from the coarse timing error determines the timing error TE.

These and other features of the present invention will be readily apparent to persons of ordinary skill in the art upon reading the entirety of this disclosure, which includes the accompanying drawings and claims.

DESCRIPTION OF THE DRAWINGS

FIG. 3(*b*) shows a timing diagram of the edge detector of FIG. 3(*a*) when the delayed dither signal is a binary zero.

FIG. 3(*c*) shows a timing diagram of the edge detector of FIG. 3(*a*) when the delayed dither signal is a binary one.

FIG. 4(*b*) schematically shows an embodiment of a ripple counter.

FIG. 4(*c*) shows a timing diagram of the asynchronous counter of FIG. 4(*a*).

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
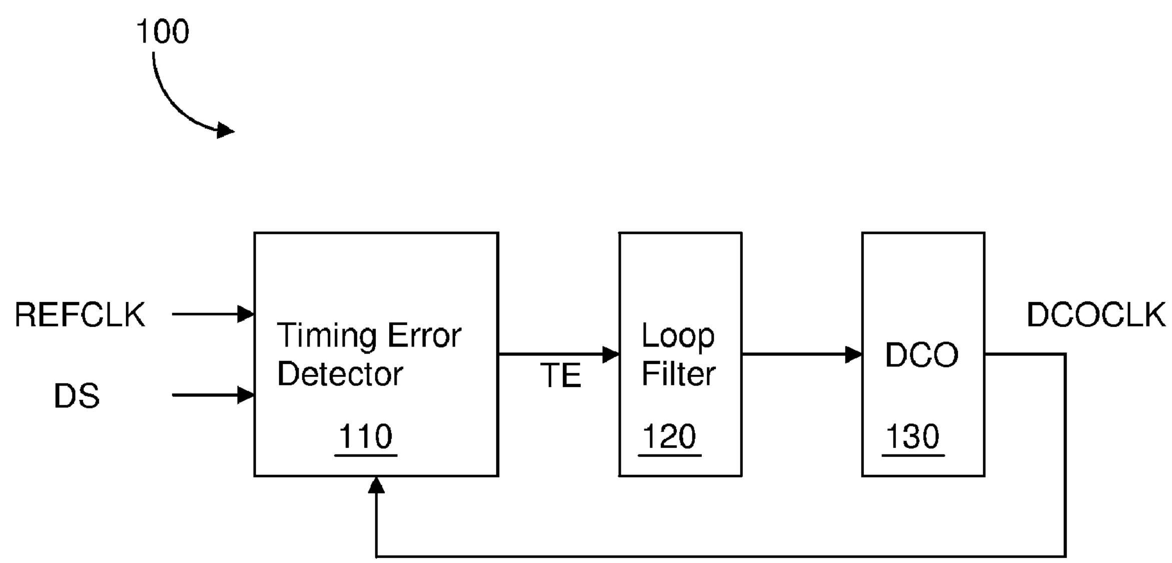
FIG. 1 shows a block diagram of an all-digital phase-locked loop in accordance with this present invention.

FIG. 1 shows an all-digital phase-locked loop in accordance with the present invention. The all-digital phase-locked loop 100 comprises a timing error detector 110, a loop filter 120, and a digitally controlled oscillator (DCO) 130. In one embodiment, the timing error detector 110 is configured to receive a first clock DCOCLK from the digitally controlled oscillator 130, a second clock REFCLK, and a dither signal DS and to generate a timing error TE between the first clock and a fictitiously desired clock. The fictitiously desired clock is derived from the second reference clock REFCLK. The loop filter 120 uses the timing error TE to generate a control signal to adjust the oscillation frequency of the DCO 130. The timing error detector 110 operates in a fashion to reduce the timing error between the first clock and the fictitiously desired clock. The dither signal DS is employed to reduce or eliminate the reference and fraction spurs of the first clock. If dithering is not required, the dither signal DS can be omitted or defaulted to zero.

Figure 2:
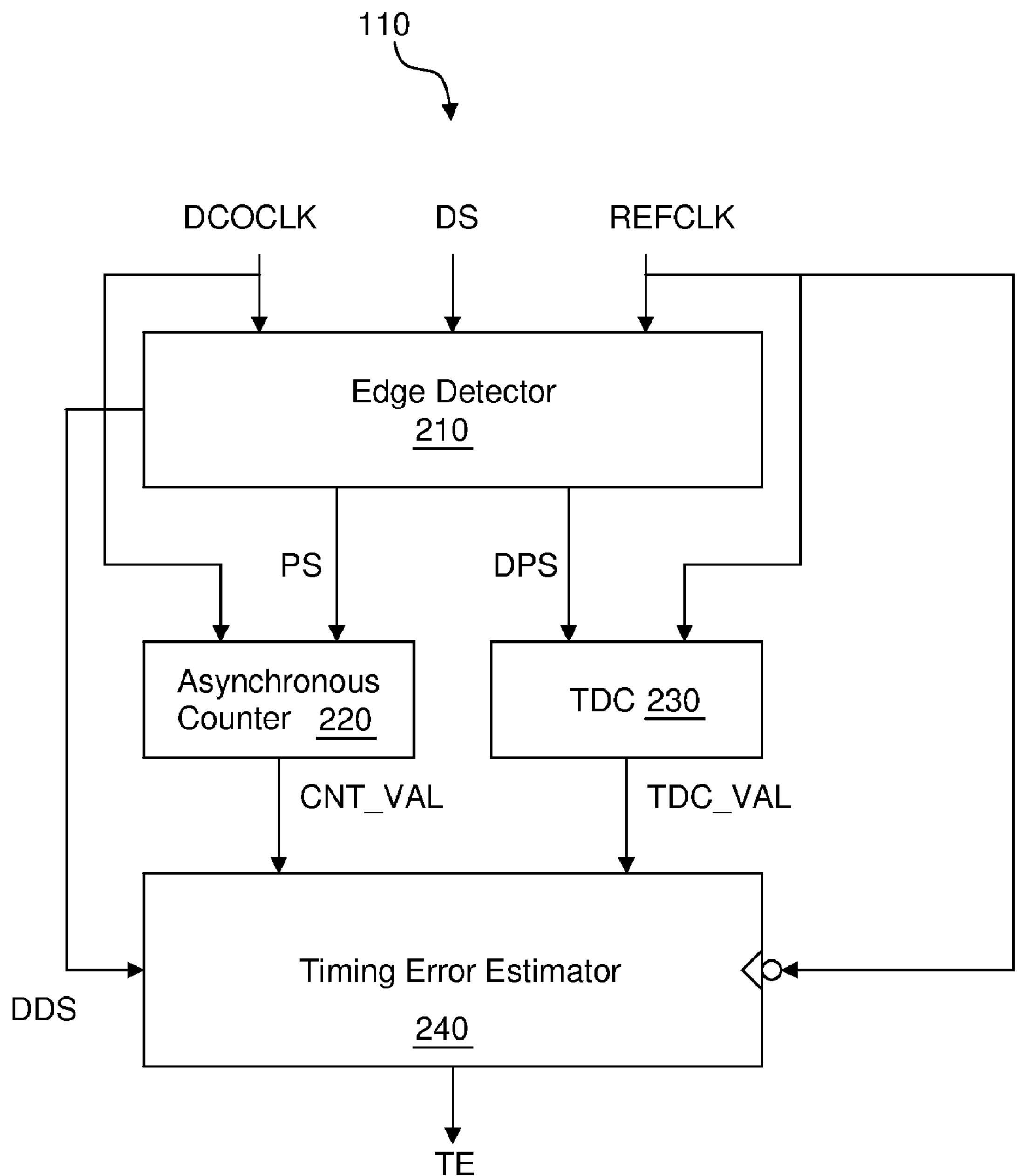
FIG. 2 schematically shows a timing error detector in accordance with an embodiment of the present invention.

FIG. 2 shows the details of the timing error detector in accordance with the present invention. The timing error detector 110 comprises an edge detector 210, an asynchronous counter 220, a time-to-digital converter (TDC) 230, and a timing error estimator 240. In one embodiment, the edge detector 210 is configured to receive the first clock DCOCLK, the second clock REFCLK, and the dither signal DS and to generate a pulse signal PS, a dithered pulse signal DPS, and a delayed dither signal DDS. The edge detector detects a rising edge of the second clock REFCLK to generate the corresponding pulse signal PS. The dither signal DS is re-synchronized with the second clock REFCLK to become the delayed dither signal DDS. Dependent on the binary value of the delayed dither signal, the dithered pulse signal DSP is generated accordingly.

In one embodiment, the asynchronous counter 220 is configured to receive the first clock DCOCLK and the pulse signal PS and to generate a first digital value CNT_VAL that is the number of the rising edges of the first clock between two neighboring rising edges of the pulse signal PS. The first digital value CNT_VAL is used in the timing error estimator 240 to determine a rough timing error.

In one embodiment, the time-to-digital converter 230 is configured to receive the second clock REFCLK and the dithered pulse signal DPS and to generate a second digital value TDC_VAL that estimates the timing difference between a rising edge of the second clock REFCLK and the immediately followed rising edge of the dithered pulse signal DPS. The second digital value TDC_VAL is used in the timing estimator 240 to determine a fine timing error.

In one embodiment, the timing error estimator 240 is configured to receive the first digital value CNT_VAL, the second digital value TDC_VAL, the delayed dither signal DDS, and the second clock REFCLK and to generate the timing error TE. The timing error estimator 240 uses the first digital value CNT_VAL to generate the coarse timing error whereas it uses the delayed dither signal DDS and the second digital value TDC_VAL to generate the fine timing error. The subtraction of the fine timing error from the coarse timing error determines the timing error TE.

Figure 3A:
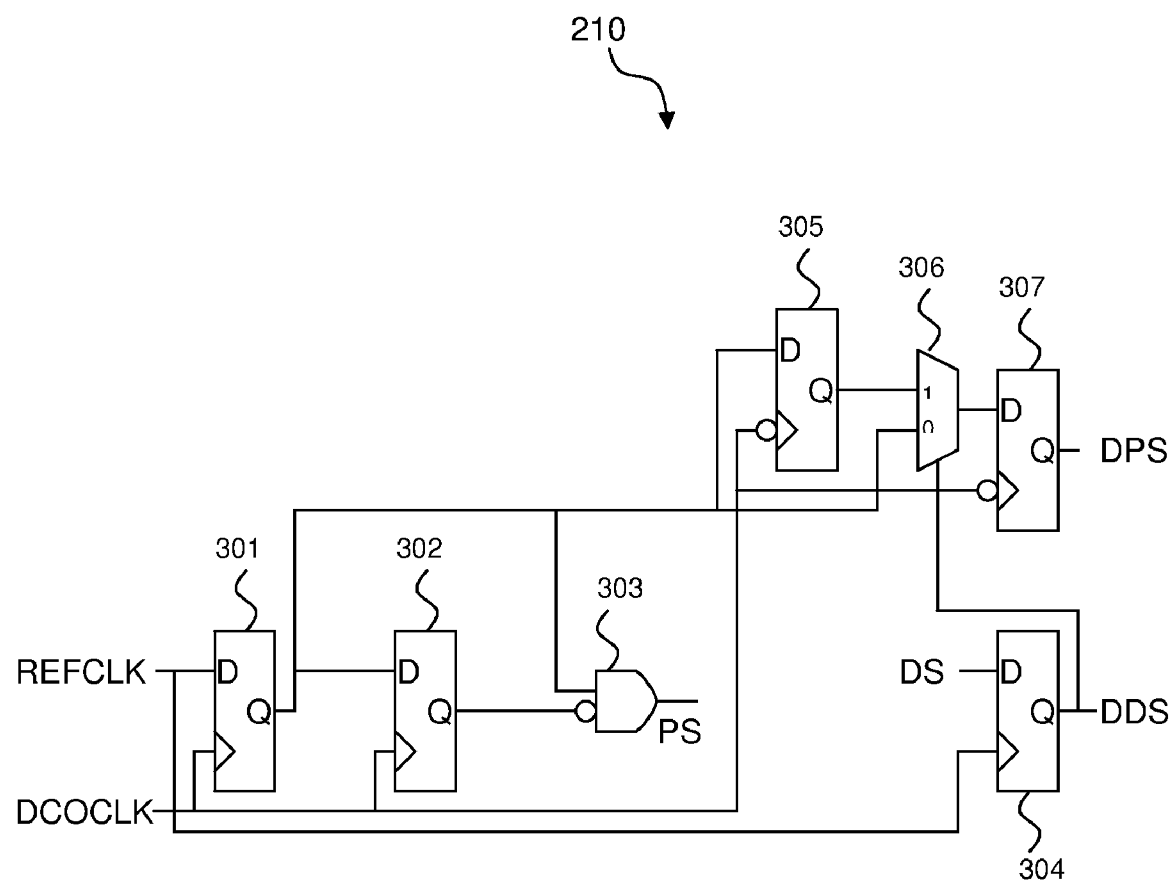
FIG. 3(*a*) schematically shows an edge detector in accordance with an embodiment of the present invention.
Figure 3B:
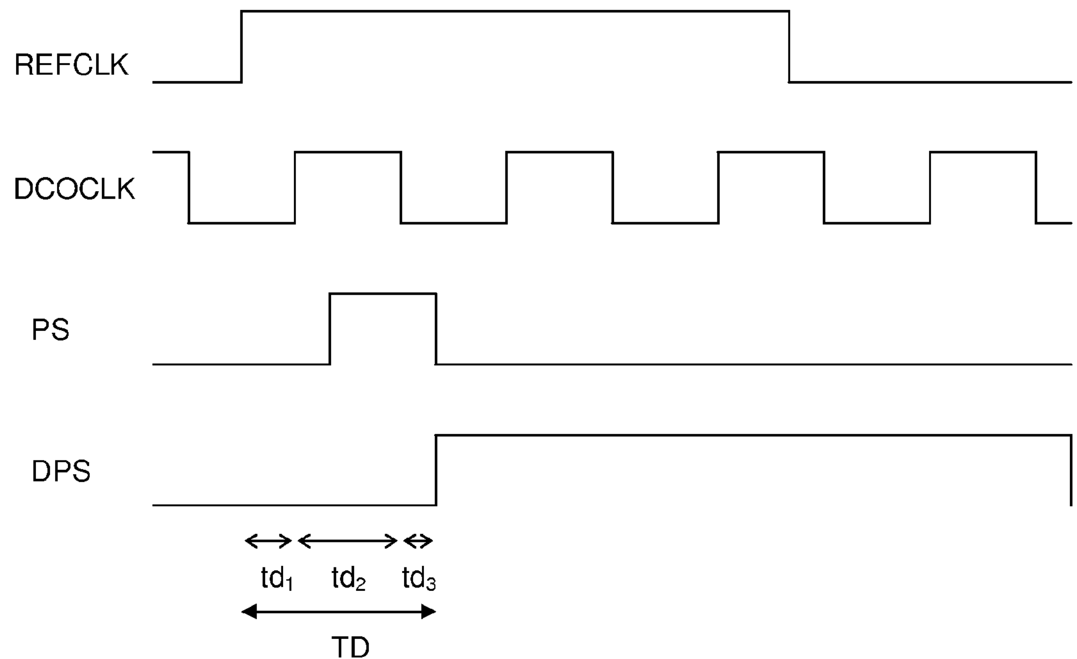
Figure 3C:
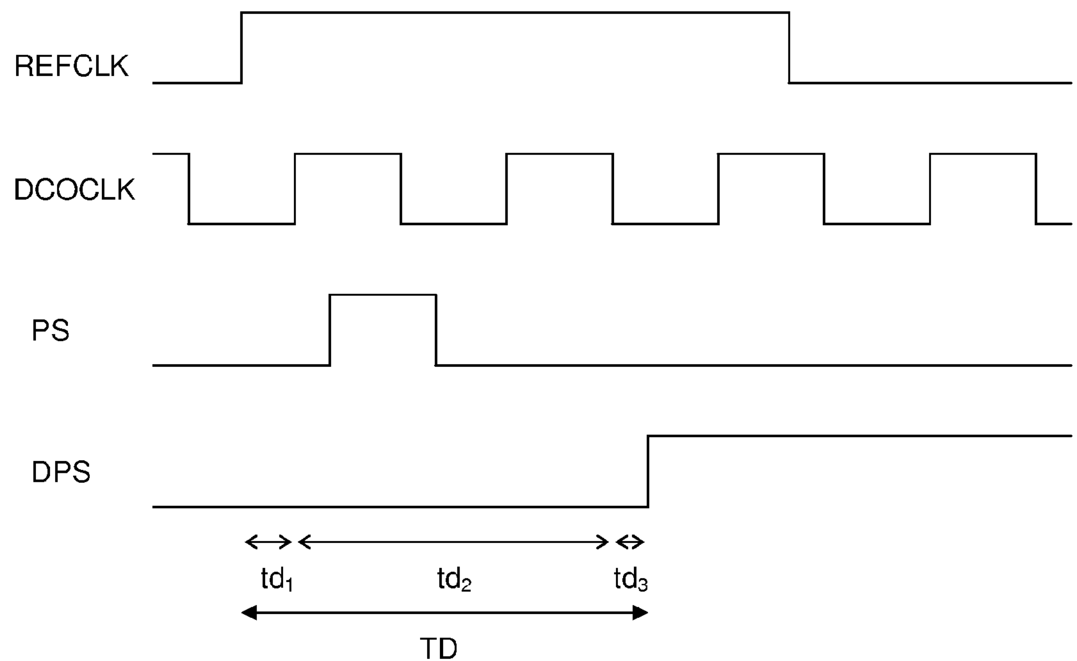

FIG. 3(*a*) schematically shows the details of the edge detector 210 of FIG. 2 in accordance with an embodiment of the present invention. In one embodiment, the edge detector 210 is configured to receive the first clock DCOCLK, the second clock REFCLK, and the dither signal DS and to generate the pulse signal PS, the dithered pulse signal DPS, and the delayed dither signal DDS. In the example of FIG. 3(*a*), the edge detector 210 uses a flip-flop 301, a flip-flop 302, and a logic gate 303 to detect a rising edge of the second clock REFCLK and generate the corresponding pulse signal PS. It employs the first clock DCOCLK to clock the flip-flop 301 to sample the second clock REFCLK. The output of the flip-flop 301 is connected to the data input of the flip-flop 302 that is also clocked by the first clock DCOCLK. The output of the flip-flop 301 and the negated output of the flip-flop 302 are ANDed together to generate the pulse signal PS.

It further uses a flip-flop 304 to resynchronize the dither signal DS to generate the delayed dither signal DDS. The flip-flop 304 is clocked by the rising edge of the second clock REFCLK. The edge detector 210 also uses a flip-flop 305, a multiplexer 306, and a flip-flop 307 to generate the delayed dither signal DPS. The output of the flip-flop 301 is connected to the data input of the flip-flop 305 that is clocked by the falling edge of the first clock DCOCLK. If the delayed dither signal DDS is a binary zero, the output of the flip-flop 301 is coupled to the output of the multiplexer 306. If the delayed dither signal DDS is a binary one, the output of the flip-flop 305 is coupled to the output of the multiplexer 306. The output of the multiplexer 306 is connected to the data input of the flip-flop 307 that is clocked by the falling edge of the first clock DCOCLK. The flip-flop 307 generates the dithered pulse signal DPS. In this embodiment, the dithered amount is either a half of the first clock cycle or one and a half of the first clock cycles. If the delayed dither signal DDS is a binary zero, the dithered amount is equal to a half of the first clock cycle. If the delayed dither signal DDS is a binary one, the dithered amount is equal to one and a half of the first clock cycles. Without explicit specifications, numerous different dithered times can be applied in different embodiments and the values of the dither signal are not restricted to be binary. Dithering is aimed to reduce or eliminate the reference or fractional spurs of the first clock DCOCLK.

FIG. 3(*b*) shows a timing diagram of the edge detector 210 when the delayed dither signal is a binary zero. FIG. 3(*c*) shows a timing diagram of the edge detector 210 when the delayed dither signal is a binary one. The timing difference TD between a rising edge of the second clock REFCLK and the immediately followed rising edge of the dithered pulse signal DPS includes three components. The first component $td_1$ is the timing difference between a rising edge of the second clock REFCLK and the immediately followed rising edge of the first clock DCOCLK. The second component $td_2$ is the dither amount. The third component $td_3$ is the flip-flop delay.

Figure 4A:
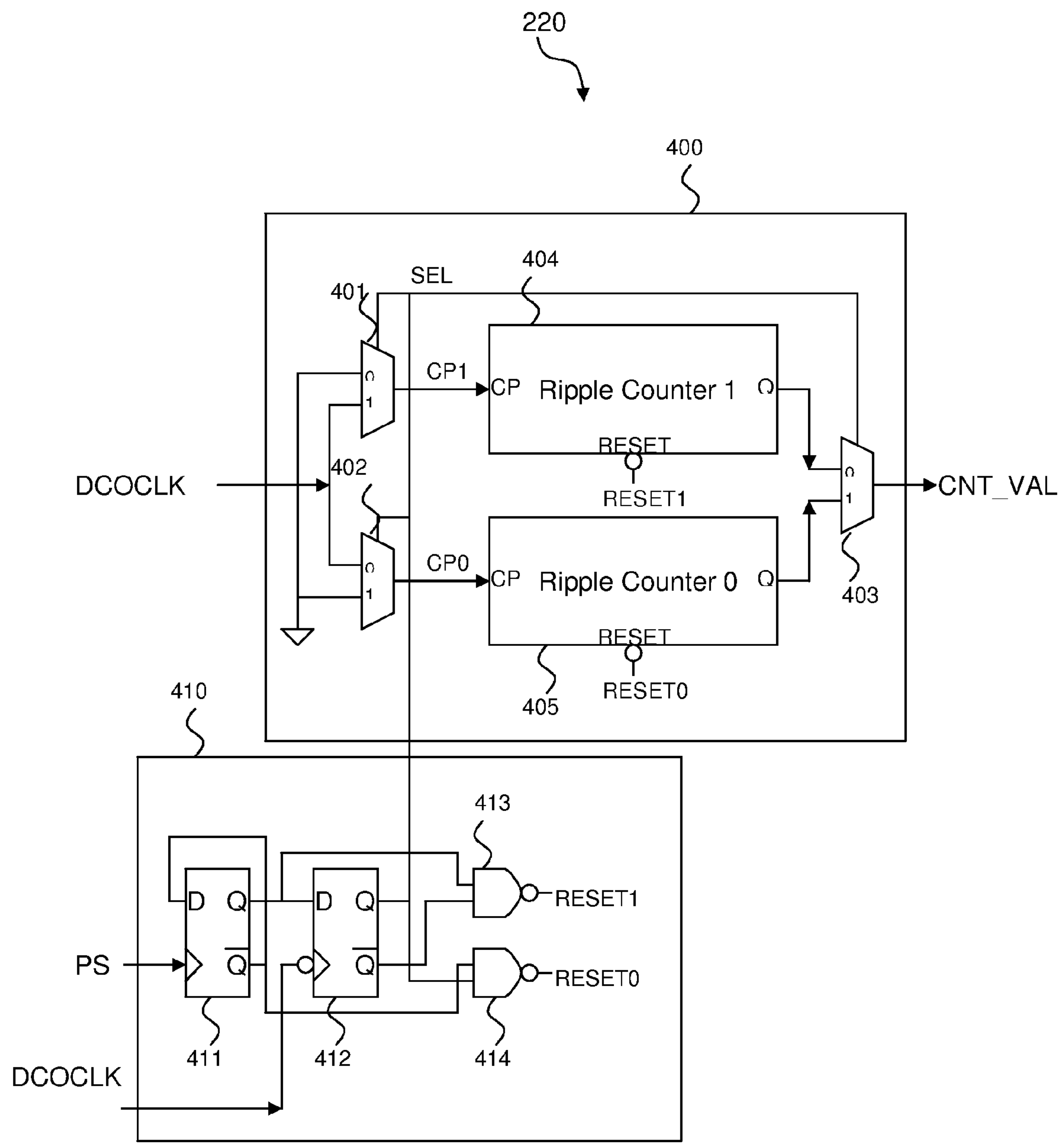
FIG. 4(*a*) schematically shows an asynchronous counter in accordance with an embodiment of the present invention.
Figure 4B:
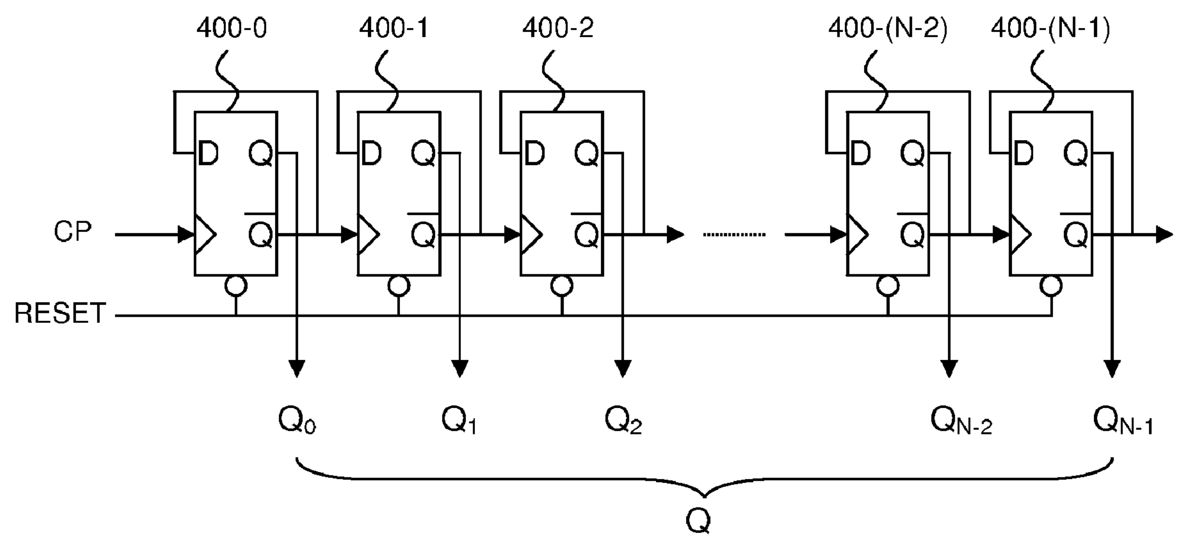
Figure 4C:
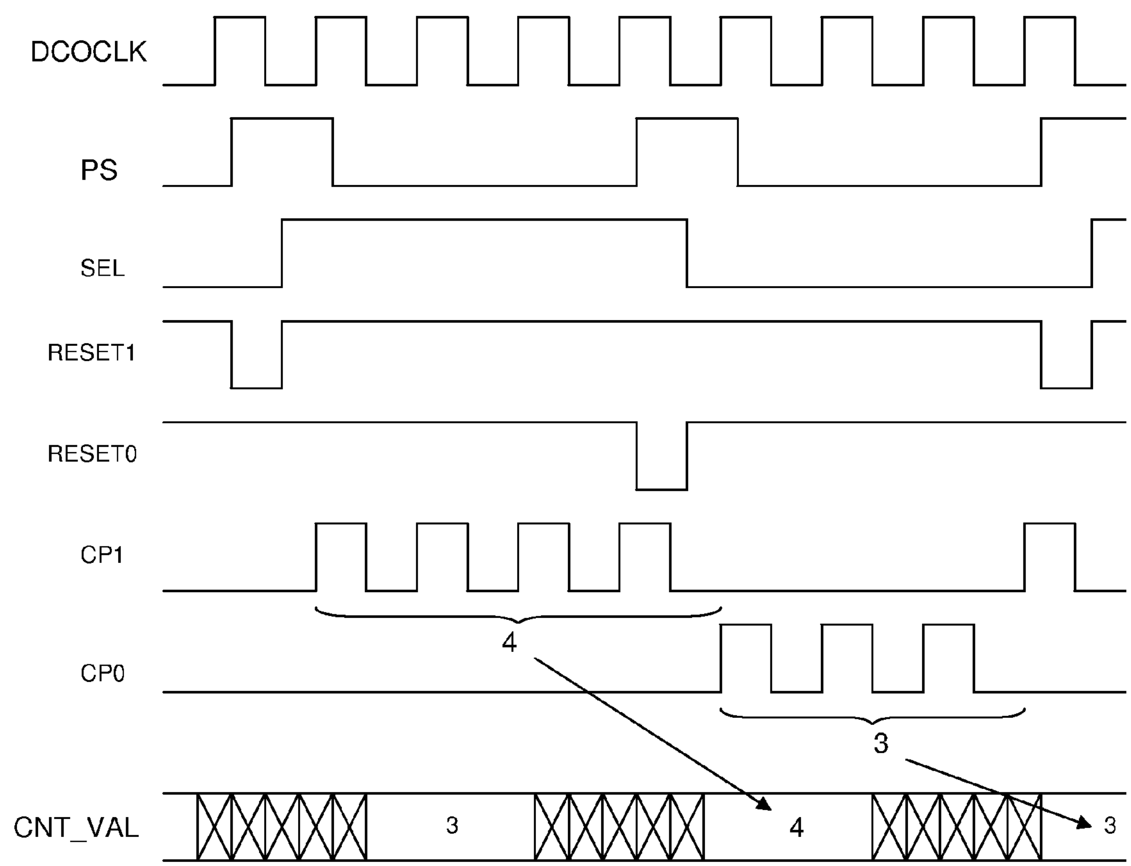

FIG. 4 schematically shows details of the asynchronous counter 220 in accordance with an embodiment of the present invention. In one embodiment, the asynchronous counter 220 is configured to receive the first clock DCOCLK and the pulse signal PS and to generate the first digital value CNT_VAL that is the number of the rising edges of the first clock DCOCLK between two neighboring rising edges of the pulse signal PS. The first digital value CNT_VAL is a multi-bit digital value, with its bit width dependent on the maximally possible number of rising edges between two neighboring rising edges of the pulse signal PS.

The accumulation of the first digital values CNT_VAL represents the total number of the rising edges of the first clock DCOCLK received so far. Subtracting an expected value from the accumulated number gives a coarse timing error. The present invention pertains to use the asynchronous counter in a method to estimate the timing error in the all-digital phase-locked loop 100. The embodiment is called an asynchronous ping-pong counter. While this embodiment of the asynchronous ping-pong counter is described hereafter, it will be apparent to those of ordinary skill in the art that many more embodiments and implementations are possible that are within the scope of the invention.

In the example of FIG. 4(*a*), the asynchronous ping-pong counter comprises a dual ripple counter 400 and a finite state machine 410. The dual ripple counter 400 comprises a multiplexer 401, a multiplexer 402, a multiplexer 403, a first ripple counter 404, and a second ripple counter 405. The dual ripple counter 400 operates in a ping-pong mode. Each timing period between two neighboring rising edges of the pulse signal is called a time slot. When one ripple counter is used to receive the rising edges of the first clock DCOCLK in the current time slot, the other ripple counter is used to calculate the number of the rising edges of the first clock DCOCLK in the previous time slot and generate the first digital value CNT_VAL and vice versa.

FIG. 4(*b*) schematically shows a ripple counter 404 (or 405) in accordance with an embodiment of the present invention. The ripple counter 404 (or 405) comprises a series of connected flip-flops 400-0~400-(N-1). The total number (i.e. N) of the required flip-flops depends on the maximally possible number of rising edges of the input signal CP. Each flip-flop has a clock input pin, a data input pin, an output pin, a negated output pin, and a reset pin. A rising edge at the clock input pin of a flip-flop samples a binary value at the data input pin into the output pin and its negative value into the negated output pin. A binary zero at the reset pin will reset the flip-flop such that the values at its output pin and negative output pin become a binary zero and a binary one, respectively. The clock input pin of the flip-flop 400-0 is driven by the input signal CP. The clock input pins of the other flip-flops (400-1 to 400-(N-1)) are driven by the negated outputs of the proceeding flip-flops. Due to the nature of the ripple counter, the rising edges of the input signal CP are rippled through the counter. After the ripple stops, the data at the output pins of all the flip-flops represents the number of the rising edges of the input signal CP. When the reset signal RESET changes to a binary zero, all the flip-flops will be reset.

The choice of the ripple counter in the asynchronous counter 220 depends on the binary value of a signal SEL that is generated by the finite state machine 410. When the signal SEL is a binary one, the multiplexer 401 couples the first clock DCOCLK to the input signal CP of the first ripple counter 404 whereas the input signal CP of the second ripple counter 405 is tied to a binary zero through the multiplexer 402. In the same time slot, the output signal Q of the second ripple counter 405 is coupled to the output CNT_VAL through the multiplexer 403. This configuration is for the first ripple counter to receive the first clock DCOCLK in the current time slot and for the second ripple counter to stop receiving the first clock DCOCLK and to generate the number of the rising edges of the first clock DCOCLK in the previous time slot.

When the signal SEL is a binary zero, the multiplexer 402 couples the first clock DCOCLK to the input signal CP of the second ripple counter 405 whereas the input signal CP of the first ripple counter 404 is tied to a binary zero through the multiplexer 401. In the same time slot, the output signal Q of the first ripple counter 404 is coupled to the output CNT_VAL through the multiplexer 403. This configuration is for the second ripple counter to receive the first clock DCOCLK in the current time slot and for the first ripple counter to stop receiving the first clock DCOCLK and to generate the number of the rising edges of the first clock DCOCLK in the previous time slot.

The pulse signal PS generated by the edge detector 210 is input to the finite state machine 410. The finite state machine 410 comprises a flip-flop 411, a flip-flop 412, a NAND gate 413, and another NAND gate 414. The pulse signal PS continuously toggles the flip-flop 411. The output of the flip-flop 411 is connected to the data input of the flip-flop 412 that is clocked by the falling edge of the first clock DCOCLK. The binary data at the output pin of the flip-flop 412 is the signal SEL. Because the flip-flop 412 is clocked by the falling edge of the first clock DCOCLK, the signal SEL always changes its value when the first clock DCOCLK is a binary zero. In doing so, no glitches will be generated at the signal nets CP1 and CP0 inside the dual ripple counter 400 when the signal SEL switches its value from a binary one to a binary zero or from a binary zero to a binary one.

Before the signal SEL switches to a binary one, the NAND gate 413 is used to generate a binary zero (RESET1) to clear the old content of the first ripple counter 404. When the value of the signal SEL becomes a binary one, the first clock is coupled to the input of the first ripple counter 404 through the multiplexer 401 and the first ripple counter 404 receives the rising edges of the first clock in the current time slot. Meanwhile, the second ripple counter 405 stop receiving any more rising edges of the first clock by tying its input to a binary zero through the multiplexer 402 and its output is coupled to the output CNT_VAL through the multiplexer 403.

Before the signal SEL switches to a binary zero, the NAND gate 414 generates a binary zero (RESET0) to clear the old content of the second ripple counter 405. When the value of the signal SEL becomes a binary zero, the first clock is coupled to the input of the second ripple counter 405 through the multiplexer 402 and the second ripple counter 405 receives the rising edges of the first clock in the current time slot. Meanwhile, the first ripple counter 404 stops receiving any more rising edges of the first clock by tying its input to a binary zero through the multiplexer 401 and its output is coupled to the output CNT_VAL through the multiplexer 403. FIG. 4(*c*) shows a timing diagram of the asynchronous counter in accordance with an embodiment of the present invention.

Figure 5:
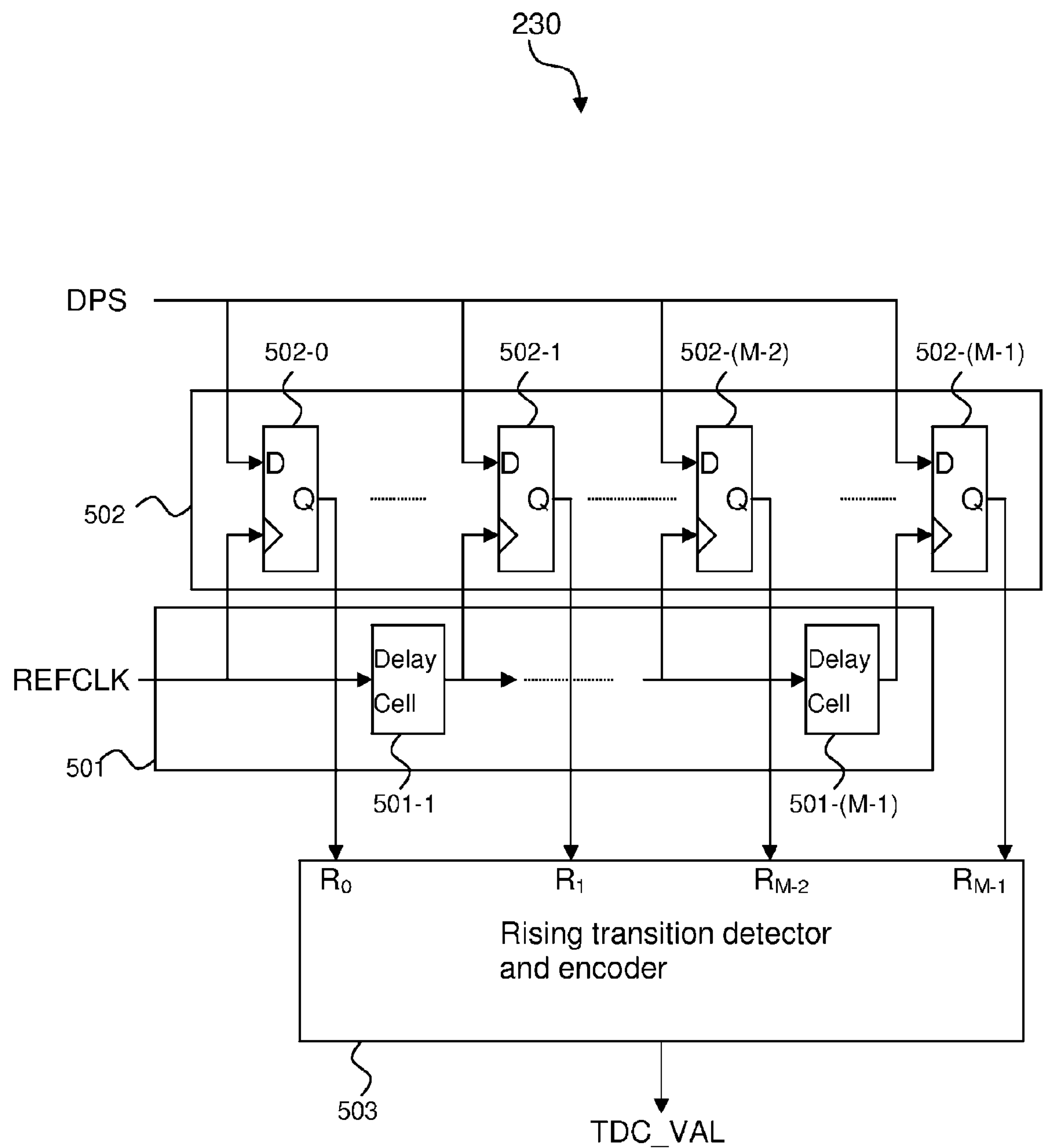
FIG. 5 schematically shows a time-to-digital converter in accordance with an embodiment of the present invention.

In one embodiment, the time-to-digital converter 230 is configured to receive the second clock REFCLK and the dithered pulse signal DPS and to generate a second digital value TDC_VAL that estimates the timing difference between a rising edge of the second clock REFCLK and the immediately followed rising edge of the dithered pulse signal DPS. FIG. 5 schematically shows details of the TDC 230 in accordance with an embodiment of the present invention. The TDC 230 comprises a plurality of delay cells 501, a plurality of flip-flops 502, and a rising edge detection logic (rising transition detector and encoder) 503. The second clock REFCLK propagates through the plurality of delay cells 501 to generate the plurality of multi-phase clocks. Each of the delay cells has a nominal buffer delay of Δ. The plurality of multiphase clocks are used to sample the dithered pulse signal DPS in the plurality of flip-flops 502. The total number (i.e. M) of the required delay cells and flip-flops depends on the maximally possible timing difference TD between the rising edges of the second clock REFCLK and the dithered pulse signal DPS. The sampled results from the plurality of flip-flops 502 are input to the rising edge detection logic 503 to generate the second digital value TDC_VAL. The second digital value TDC_VAL is a multi-bit digital value, with its bit width dependent on the maximally possible timing difference TD between the rising edges of the second clock REFCLK and the dithered pulse signal DPS.

The rising edge detection logic 503 may determine the second digital value TDC_VAL using the following algorithm:

```
if (R(0)==1) TDC_VAL = 0,
else if (R(1)==1 & R(0)==0) TDC_VAL = 1,
else if (R(2)==1 & R(1)==0) TDC_VAL = 2,
else if (R(3)==1 & R(2)==0) TDC_VAL = 3,
.
.
.
else if (R(M−1)==1 & R(M−2)==0) TDC_VAL = M−1,
else TDC_VAL =M;
```

Figure 6:
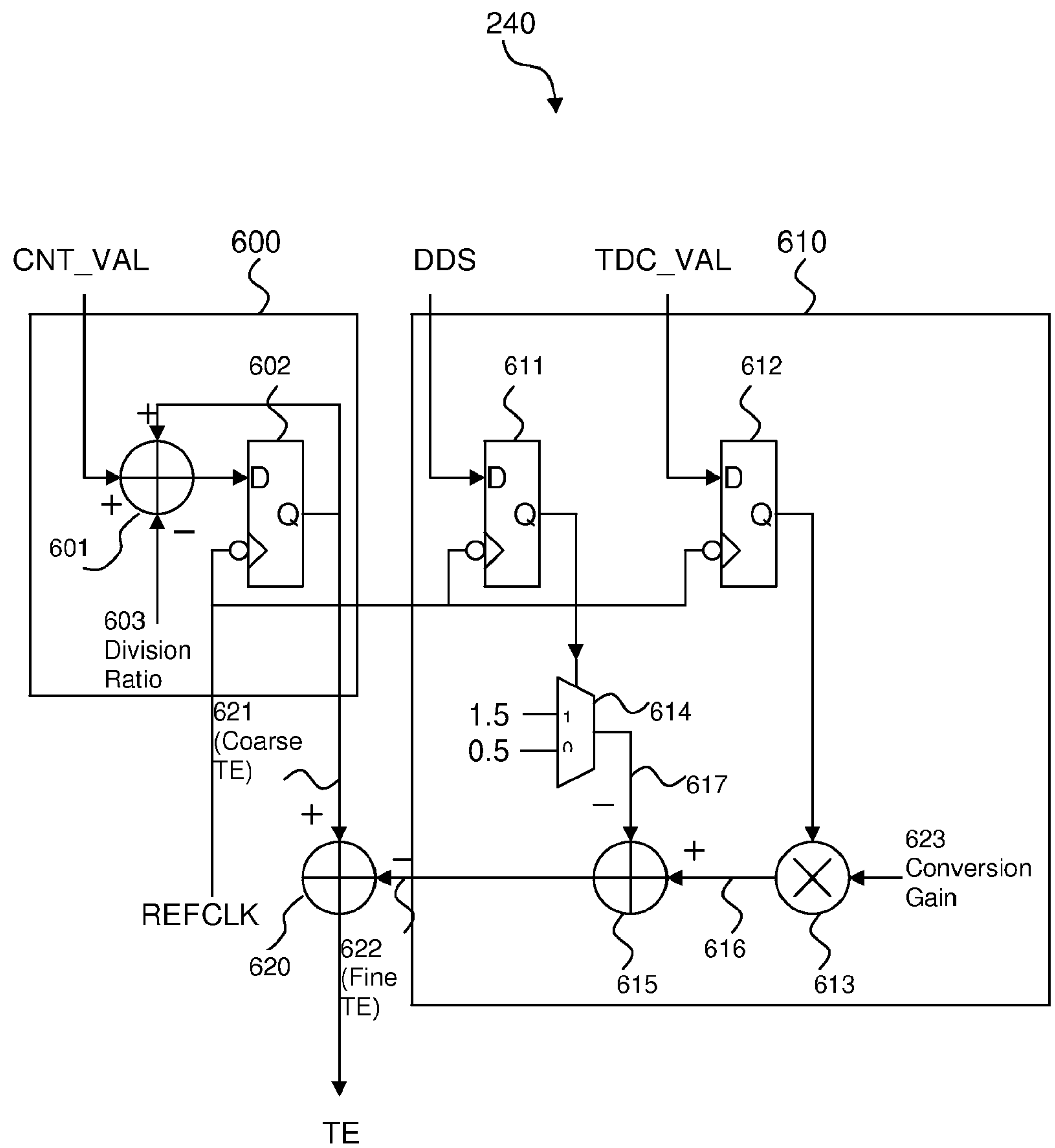
FIG. 6 schematically shows a timing error estimator in accordance with an embodiment of the present invention.

In one embodiment, the timing error estimator 240 is configured to receive the delayed dither signal DDS, the first digital value CNT_VAL, the second digital value TDC_VAL, and the second clock REFCLK and to generate the timing error TE. FIG. 6 schematically shows details of the timing error estimator 240 in accordance with an embodiment of the present invention. The timing error estimator 240 is used to estimate the timing error TE in the phase-locked loop 100. The timing error estimator 240 includes a rough timing error estimator 600, a fine timing error estimator 610, and a summer 620.

The rough timing estimator 600 is configured to receive the first digital value CNV_VAL and the second clock REFCLK and to generate a rough timing error 621. The first digital value CNT_VAL is the number of the rising edges of the first clock DCOCLK in each time slot. A timing error of the current time slot can be calculated by subtracting a required division ratio 603 from the first digital value CNV_VAL. The accumulation of this timing error gives the rough timing error 621. This rough timing error 621 is coarse in nature because its quantization interval is one cycle of the first clock. The rough timing estimator 600 includes a summer 601 and a plurality of flip-flops 602 to store the rough timing error 621. The total required number of the plurality of flip-flops 602 has to be large enough to store the maximal value and minimal value of the rough timing error 621. The plurality of the flip-flops 602 is clocked by the falling edge of the second clock REFCLK. In doing so, the first digital value CNT_VAL is allowed to have enough times to become stable.

The fine timing estimator 610 is configured to receive the delayed dither signal DDS, the second digital value TDC_VAL, and the second clock REFCLK and to generate a fine timing error 622. The second digital value TDC_VAL gives an estimate of the timing difference TD between a rising edge of the second clock REFCLK and the immediately followed rising edge of the dithered pulse signal DPS. The timing difference TD is measured with regard to the number of buffer delay Δ in the time-to-digital converter 230 to give the second digital value TDC_VAL. The resolution of the TDC_VAL is finer because its quantization interval is only one buffer delay Δ. But the first digital value CNT_VAL is represented with regard to the number of the first clock cycles. A conversion gain 623 is multiplied with the second digital value TDC_VAL to convert its format to the same representation as the first digital value CNT_VAL.

The fine timing estimator 610 includes a flip-flip 611, a plurality of flip-flops 612, a multiplier 613, a multiplexer 614, and an adder 615. The flip-flop 611 and the plurality of flip-flops 612 are clocked by the falling edge of the second clock REFCLK. In doing so, the second digital value TDC_VAL and the delayed dither signal DDS are allowed to have enough times to become stable. By multiplying the output of the plurality of flip-flops 612 with the conversion gain 623 in the multiplier 613, the error 616 is now represented with regard to the number of the first clock cycles.

Dependent on the delayed dither signal DDS, the dithered pulse signal DPS is delayed by a fixed delay time, $td_2$, in the edge detector 210. If the delayed dither signal DDS is a binary zero, the delayed amount is equal to a half of the first clock cycle. If the delayed dither signal DDS is a binary one, the delayed amount is equal to one and a half of the first clock cycles. This amount of 0.5 or 1.5 is selected by the multiplexer 614 and subtracted from the error 616 in the summer 615 to estimate the timing difference of $td_1$ between a rising edge of the second clock REFCLK and the immediately followed rising edge of the first clock DCOCLK. The output of the summer 615 is the fine timing error 622.

The timing error TE is obtained from the summer 620 by subtracting the fine timing error 622 from the coarse timing error 621.

Asynchronous counter based timing detection has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus for receiving a first clock signal and a second clock signal and outputting a digital code, the apparatus comprising:

a sampling circuit for using a sampling of the second clock signal by the first clock signal to generate a first intermediate clock signal and a second intermediate clock signal;

an asynchronous counter for outputting a first intermediate code for representing a number of clock edges of the first clock signal within a duration defined by the first intermediate clock signal;

a TDC (time-to-digital converter) for outputting a second intermediate code to represent a timing relationship between the second intermediate clock signal and the second clock signal; and a processor for generating the digital code based on a weighted sum of the first intermediate code and the second intermediate code.

2. The apparatus of claim 1, wherein a timing relationship between the first intermediate clock signal and the second intermediate clock is controlled by a dither signal.

3. The apparatus of claim 2, wherein a timing difference between the first intermediate signal and the second intermediate signal is approximately half cycle of the first clock signal when the dither signal is a first value, and is approximately one-and-half cycles of the first clock signal when the dither signal is a second value.

4. The apparatus of claim 2, wherein a timing difference between the second intermediate signal when the dither signal is a first value and the second intermediate signal when the dither signal is a second value is approximately one cycle of the first clock signal.

5. The apparatus of claim 1, wherein the processor is operating in accordance with a timing of the second clock signal.

6. The apparatus of claim 1, wherein the sampling circuit comprises at least a flip-flop triggered at an edge of the first clock signal.

7. The apparatus of claim 1, wherein the asynchronous counter comprises two ripple counters.

8. The apparatus of claim 7, wherein the asynchronous counter comprises a finite state machine.

9. The apparatus of claim 1, wherein the sampling circuit comprises:

an edge detection circuit for outputting the first intermediate clock signal by detecting an edge of the second clock signal based on a sampling of the first clock signal; and a dithering circuit for outputting the second intermediate clock signal, wherein a timing difference between the delayed edge signal and the edge signal is controlled by controlled by a dither signal.

10. A method for estimating a timing difference between a first clock signal and a second clock signal, the method comprising:

generating an edge signal by detecting an edge of the second clock signal by sampling the second clock signal using the first clock signal;

generating a delayed edge signal by a further sampling of the second clock signal using the first clock signal;

generating a first intermediate code by counting a number of clock edges of the first clock signal within a duration defined by the edge signal using an asynchronous counter;

generating a second intermediate code to represent a timing difference between the second clock signal and the delayed edge signal using a time-to-digital converter; and generating an output code using a weighted sum of the first intermediate code and the second intermediate code.

11. The method of claim 10, wherein the asynchronous counter comprises two ripple counters.

12. The method of claim 11, wherein the asynchronous counter further comprises a finite state machine.

13. The method of claim 10, wherein a timing relationship between the edge signal and the delayed edge clock is controlled by a dither signal.

14. The method of claim 13, wherein a timing difference between the delayed edge signal when the dither signal is of the first value and the delayed edge signal when the dither signal is of the second value is approximately one cycle of the first clock signal.

15. The method of claim 13, wherein a timing difference between the edge signal and the delayed edge signal is approximately half cycle or one-and-half cycles of the first clock signal.

16. The method of claim 10, wherein generating the delayed edge signal further comprises using a combination of a rising edge triggered sampling device and a falling edge triggered sampling device.

17. The method of claim 10, wherein generating the output code further comprises updating the output code in accordance with a timing of the second clock signal.

18. An apparatus for generating an output clock signal according to an input clock signal, the apparatus comprising:

a timing error detector for receiving the input clock signal and a first clock signal corresponding the output clock signal, and for outputting an output code to represent an estimate of a timing difference between the input clock signal and the first clock signal, wherein the timing error detector comprises an asynchronous counter;

a loop filter, coupled to the timing error detector, for receiving the output code to generate a control signal; and a digital controller oscillator, coupled to the loop filter, for generating the output clock signal according to the control signal.

19. The apparatus of claim 18, the timing error detector further comprising:

a sampling circuit for using a sampling of the input clock signal by the first clock signal to generate a first intermediate clock signal and a second intermediate clock signal; wherein the asynchronous counter is configured to output a first intermediate code for representing a number of clock edges of the first clock signal within a duration defined by the first intermediate clock signal;

a TDC (time-to-digital converter) for outputting a second intermediate code to represent a timing relationship between the second intermediate clock signal and the input clock signal; and a logic for outputting the output code to represent an estimate of the timing difference between the input clock signal and the first clock signal based on a weighted sum of the first intermediate code and the second intermediate code.

20. The apparatus of claim 19, wherein a timing difference between the first intermediate signal and the second intermediate signal is approximately half cycle of the first clock signal or one-and-half cycles of the first clock signal.

21. The apparatus of claim 19, wherein a timing relationship between the first intermediate clock signal and the second intermediate clock is controlled by a dither signal.

22. The apparatus of claim 21, wherein a timing difference between the second intermediate signal when the dither signal is a first value and the second intermediate signal when the dither signal is a second value is approximately one cycle of the first clock signal.

23. The apparatus of claim 19, wherein the logic is configured to output the output code based on a weighted sum of the first intermediate code, the second intermediate code, and a dither signal.

24. The apparatus of claim 18, wherein the asynchronous counter comprises two ripple counters.

* * * * *